United States Patent [19]

Marincic

[11] Patent Number: 4,845,479
[45] Date of Patent: Jul. 4, 1989

[54] HIGH RELIABILITY PWB INTERCONNECTION FOR TOUCH INPUT SYSTEMS

[75] Inventor: Emil M. Marincic, Rochester, N.Y.

[73] Assignee: Xerox Corporation, Stamford, Conn.

[21] Appl. No.: 945,104

[22] Filed: Dec. 22, 1986

[51] Int. Cl.⁴ .............................................. G09G 3/00
[52] U.S. Cl. .................................. 340/712; 340/711; 341/31
[58] Field of Search ................... 340/711, 712, 365 P, 340/365 R; 361/398, 408, 412; 250/221; 341/31

[56] References Cited

U.S. PATENT DOCUMENTS

| | | | |
|---|---|---|---|
| 3,629,787 | 12/1971 | Wilson | 361/408 |
| 3,805,213 | 4/1974 | Austin | 361/398 |
| 4,092,057 | 5/1978 | Walton | 339/17 F |
| 4,154,977 | 5/1979 | Verma | 174/117 F |
| 4,213,028 | 7/1980 | Wolf | 219/203 |
| 4,251,712 | 2/1981 | Parr | 219/203 |
| 4,509,098 | 4/1985 | Das Gupta et al. | 361/398 |
| 4,517,559 | 5/1985 | Deitch et al. | 250/221 |
| 4,591,710 | 5/1986 | Komadina et al. | 340/712 |
| 4,626,830 | 12/1986 | Noens et al. | 340/365 R |
| 4,677,252 | 6/1987 | Takahashi et al. | 361/398 |
| 4,689,446 | 8/1987 | Hasegawa et al. | 340/365 P |

FOREIGN PATENT DOCUMENTS 0097414 4/1984 European Pat. Off. .
1601000 10/1981 United Kingdom .

OTHER PUBLICATIONS

IBM Technical Disclosure Bulletin, vol. 4, No. 3, Aug. 1961, "Preparing Molded Circuits", by D. A. Radovsky.

Primary Examiner—Donald J. Yusko
Assistant Examiner—Mahamad Fatahiyar
Attorney, Agent, or Firm—Frederick E. McMullen

[57] ABSTRACT

A touch input system having a CRT with opposing rows of aligned LED's and photosensors on four printed writing boards forming a frame about the CRT screen and which establishes a grid permitting any spot where the screen is touched to be identified, and flexible circuits electrically and mechanically attaching the boards corner to corner to form the frame. In an alternate embodiment, individual circuit components are used, either alone or in combination with adhesive to mechanically attach the flexible circuits to the boards. In another alternate embodiment, a one piece flexible circuit with underlying supports along each of the four sides of the frame is used in place of the printed wiring boards.

5 Claims, 4 Drawing Sheets

HIGH RELIABILITY PWB INTERCONNECTION FOR TOUCH INPUT SYSTEMS

The invention relates to touch input systems, and more particularly to a high reliability interconnection for such systems.

A touch input system with cathode ray tube (CRT) display may be utilized to allow an operator to communicate with an apparatus such as a copier or printer. In systems of this type, the operator points, i.e., touches, the CRT screen at the point where the control instruction is displayed. The system responds by actuating the instruction pointed to.

Touch input systems of this type are typically constructed with four etched printed wiring boards (pwb) which form a box-like frame surrounding the face of the CRT screen. Metal or other rigid L-shaped connectors attached between the corners of adjoining boards retain the boards in position. Electrical interconnections between the adjacent pwbs are in the form of discrete wires soldered to terminals on the pwbs or via multi-pin connectors. However, connecting the pwbs in this fashion can adversely affect the reliability and cost of the unit. For example, reliability can suffer as a result of poor connections between the pwbs resulting from the fabrication processes due to defective wire stripping in which wire strand(s) are inadvertently cut or nicked, to low soldering iron temperatures leading to cold sober joints, to insufficient soldering time with resulting incomplete solder melt and insufficient wicking, oxidation of pins in connector configurations, etc. Further, any incipient faults resulting during fabrication can later cause failures brought about by the operating conditions or environment to which the touch input system is exposed, by wear and tear on the system, age, repeated expansion and contraction of dissimilar materials resulting from temperature changes as power to the system is turned on and off, etc.

In the present invention as will appear, flexible circuit(s) are employed, either alone or in combination with pwbs to provide a touch input system. While flexible electrical cables are known perhaps best for use as defrosting mechanisms for automobile rear windows, as shown by U.S. Pat. Nos. 4,213,028 and 4,251,712, and while various methods of fabricating flexible cable assemblies are described by U.S. Pat. Nos. 4,092,057 and 4,154,977, EPO application No. 97-414, and British Patent specification No. 1,601,000, the prior art has not addressed or attempted to solve the aforedescribed reliability and cost problems associated with current CRT based touch input systems and designs.

The present invention, in one embodiment, relates to a touch input apparatus of the type having a generally rectangular border, each side of which is formed by printed wiring boards with the wiring boards forming two adjoining sides of the border having a plurality of discrete light sources arranged in at least one longitudinally extending row and the remaining wiring boards forming the opposite two sides of the border each having a photosensor for each of the light sources, and means for physically attaching the ends of each pair of the wiring boards to one another so that the wiring boards are at substantially 90° with respect to one another to form the border with the light sources in operative relation with the photosensors, the attaching means comprising a flexible wiring circuit bent through a substantially 90° arc and attached to each of the wiring board pairs to mechanically secure the wiring board pairs together.

IN THE DRAWINGS

Figure 1:
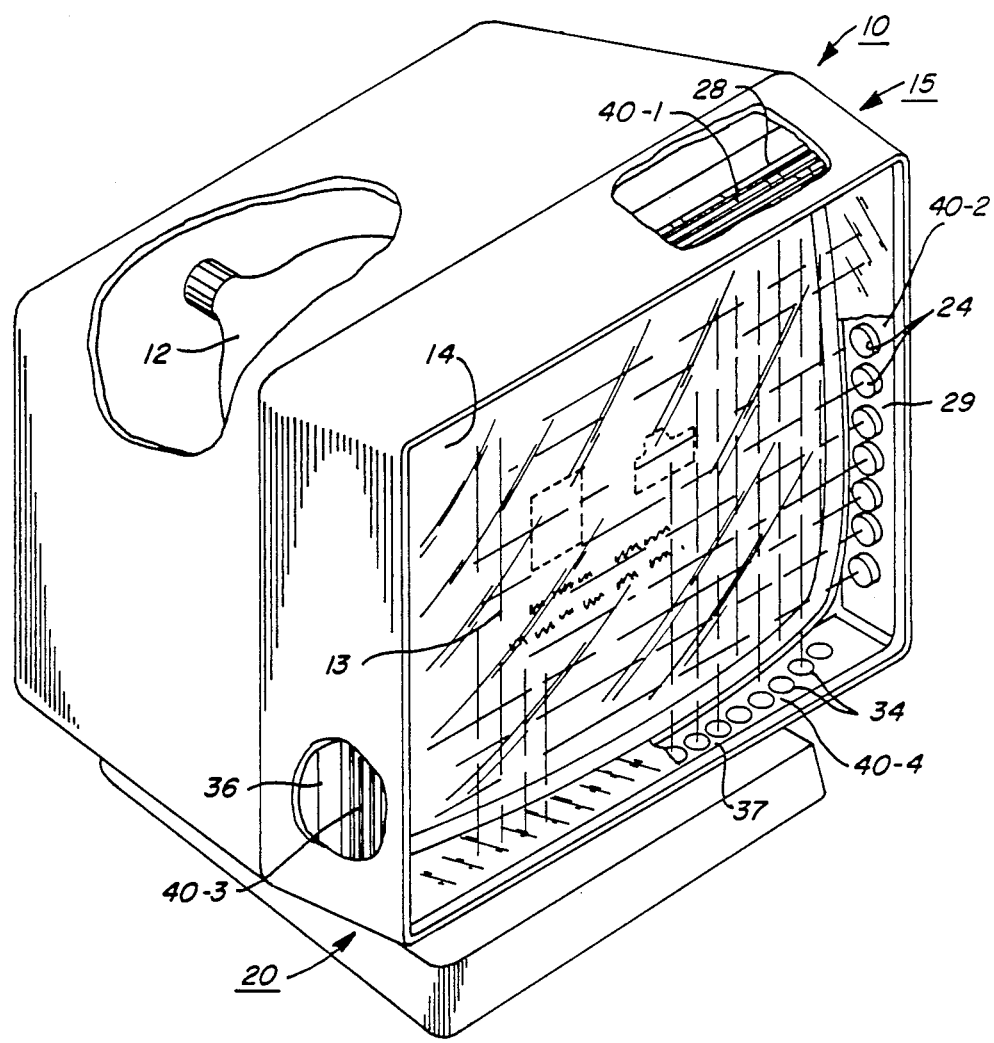
FIG. 1 is an isometric view of a prior art touch input system with CRT for displaying control instructions, the CRT screen being framed by printed wiring boards having opposing rows of LEDs and photosensors cooperable with one another to establish a grid enabling any point touched on the CRT screen to be identified.

Referring to FIG. 1, there is shown at 10 a typical touch input system. In the systems of that kind, as will be understood, a CRT 12 having a generally rectangular screen 14 displays input selections such as alphanumerics, icons, etc. that are available. By placing a pointer such as one's finger against or closely adjacent to the face of screen 14 at the point desired, a selection is made.

To enable a particular selection pointed to on screen 14 to be identified, an X, Y grid 13 formed by a plurality of individual beams of radiation is established across the face of screen 14. For this purpose, an exterior border or frame 20 surrounds screen 14, frame 20 projecting outwardly beyond the surface of screen 14 to prevent interference by the screen with the radiation beams forming grid 13.

To generate X, Y grid 13, a row of radiation emitters such as LED's 24 is provided along the top edge 28 and along one side edge 29 of screen 14. Parallel rows of radiation detectors such as photosensors 34 are provided along each of the remaining side and bottom edges 36, 37 respectively of screen 14, there being one photosensor 34 in diametrically opposed relation to each LED 24.

Figure 2:
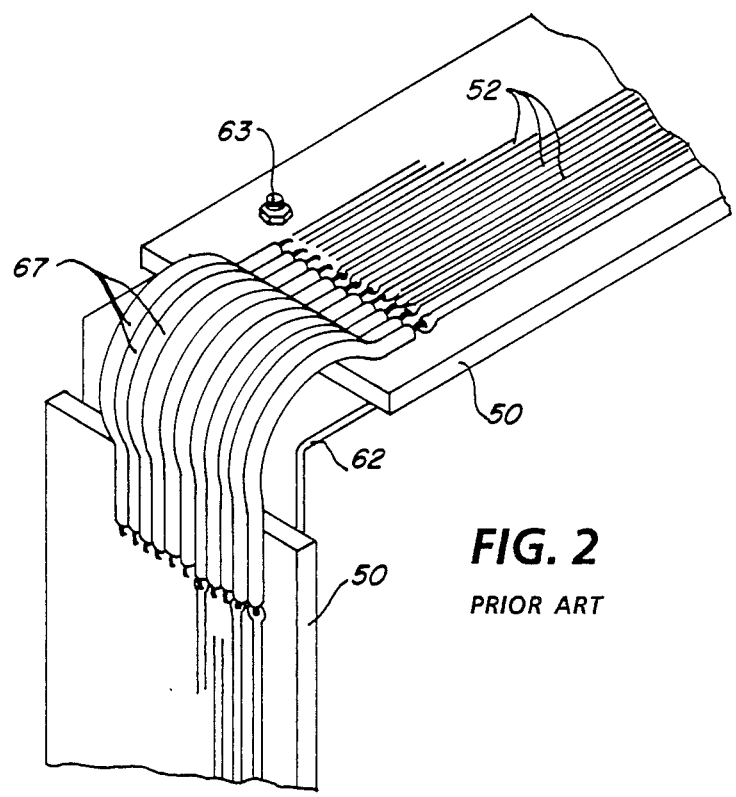
FIG. 2 is an isometric view of the touch input system shown in FIG. 1 illustrating the manner in which the printed wiring boards are mechanically and electrically coupled to one another at the corners.
Figure 3:
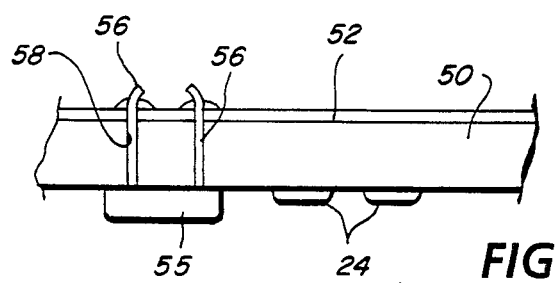
FIG. 3 is a sectional view through a printed wiring boards showing the manner in which individual circuit components such as transistors are electrically and mechanically connected to a printed wiring board.

Border 20 is composed of a four printed wiring boards 40-1, 40-2, 40-3, 40-4 disposed at substantially right angles (i.e., 90°) with respect to one another along edges 28, 29, 36, 37 respectively. Referring now to FIGS. 2 and 3, each wiring board 40-1, 40-2, 40-3, 40-4, as will be understood, consists of a generally rectangularly-shaped flat substrate or base 50 of a suitable non-conductive material such as fiber glass onto which a predetermined printed circuit pattern of conductive runs or leads 52 are formed by printed circuit manufcturing technology. Individual circuit components of the printed circuit such as LED's 24, photosensors 34, microprocessor(s), and other components such as transistor 55 are mounted on substrate 50 at preset points in the printed circuit to complete the circuit.

Circuit components such as transistor 55 typically have plural projecting leads or prongs 56 which are received in holes or apertures 58 provided at predetermined locations in the wiring board substrate 50. During fabrication of a printed wiring board, prongs 56 are inserted through the apertures 58 and electrically connectd to the adjoining conductive run(s) 52 by soldering. Prongs 56 in addition may be bent or twisted to further assure that circuit components such as transistor 55 are fixedly secured to substrate 50 in desired position.

Referring now to FIGS. 1 and 2, heretofore printed wiring boards such as boards 40-1, 40-2, 40-3, 40-4 have been secured to one another at the border corners by right angle metal clips or fasteners 62 attached to the board substrate 50 as by screws 63. Fasteners 62 permit the wiring boards 40-1, 40-2, 40-3, 40-4 to be assembled with one another to form the generally rectangular border or frame 20 dimensioned to fit partially over the edges 28, 29, 36, 37 of screen 14 of CRT 12 with a portion of the frame extending outwardly from the face of screen 14. This provides uninterrupted communication between the LED's 24 and their respective photosensors 34. The axial length of each wiring board 40-1, 40-2, 40-3, 40-4 is normally substantially equal to or slightly less than the length of the edge of CRT 12 with which the wiring board is to be associated. The assembled frame 20, once fitted over the edges of screen 14, may be held in place by the CRT outer decorative cover 15.

To electrically interconnect the printed circuits of wiring boards 40-1, 40-2, 40-3, 40-4 with one another, individual conductor wires or leads 67 are soldered to the leads 52 of the board's printed circuit 50.

The use, however, of wires 67 to interconnect the printed wiring boards can reduce reliability and increase cost. Normally this is the result of poor connections, often due to poor wire stripping which leaves one or more of the wire strands cut or nicked, poor soldering temperatures that result in cold solder joints, insufficient soldering time with resulting incomplete solder melt, insufficient wicking, etc. Additionally, the effect of poor solder connections can be exacerbated by system operating conditions such as mechanical vibration, thermal expansion and contraction of dissimilar materials, etc.

Figure 4:
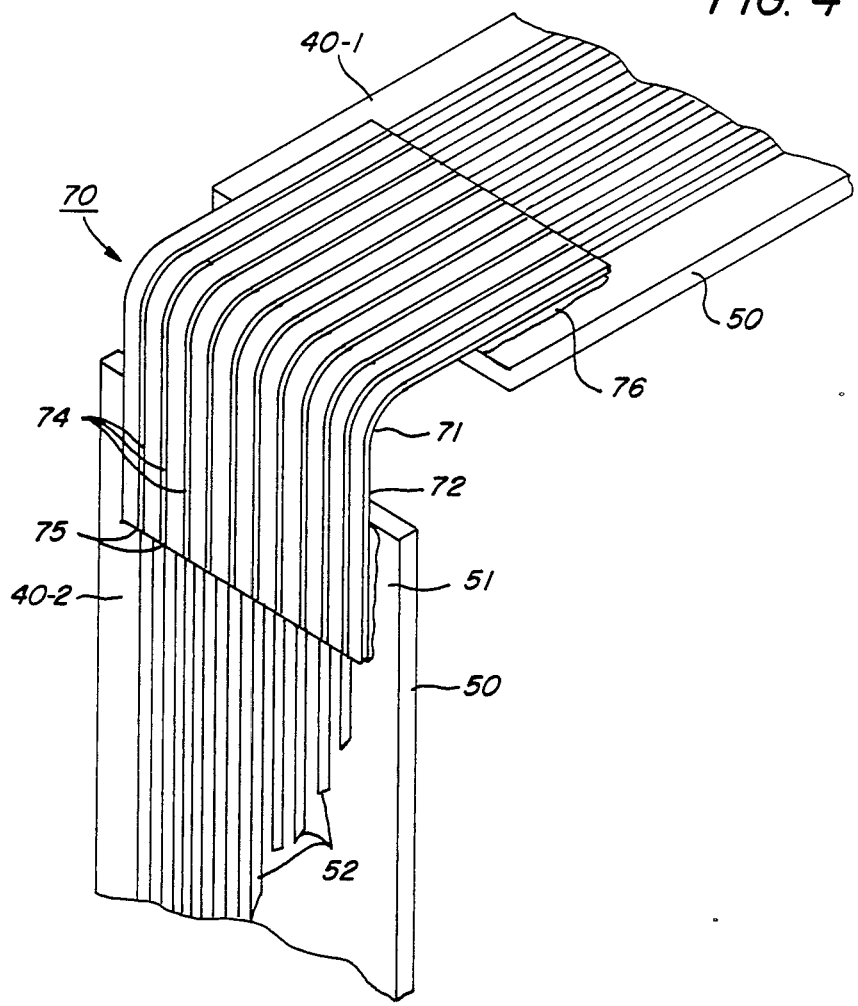
FIG. 4 is an isometric view showing details of the flexible circuit connection of the present invention in which flexible circuits secured to the printed wiring board corners by an adhesive, attach the boards in a rectangular frame with the LEDs and photosensors on the boards in aligned relation to one another.

Referring now to FIG. 4 where like numerals designate like parts, to reduce cost and enhance reliability, the printed wiring boards 40-1, 40-2, 40-3, 40-4 are all electrically and mechanically interconnected by means of a flexible printed wiring circuit 70. Printed wiring circuit 70 as will be understood by those skilled in the art consists of a flexible substrate 72 such as plastic with conductive runs or leads 74 embedded therein. Terminals 75 at the ends of leads 74 enable the leads to be electrically connected to the printed wiring board runs 52 by soldering. The flexible printed wiring circuit 70 is attached to the printed wiring boards by means of a suitable adhesive 76 between the bottom 71 of the flexible printed wiring circuit substrate 72 and the upper side or face 51 of the printed wiring board substrate 50. Other means for attaching the flexible printed wiring circuit 70 to the printed wiring boards may, however, be envisioned.

While flexible printed wiring circuit 70 is relatively free for bending along the longitudinal axis thereof, the attachment of the circuit 70 to the printed wiring boards nonetheless is sufficiently rigid to locate the boards 40-1, 40-2, 40-3, 40-4 together, and via an external mechanical feature such as frame 20, each board with respect to one another such that LEDs 24 and photosensors 34 are in proper operating alignment with one another and the boards are assembled in relatively immovable relation with respect to one another. At the same time, the flexible circuit 70 completes the conductive paths for the touch input system operating circuit.

Figure 5:
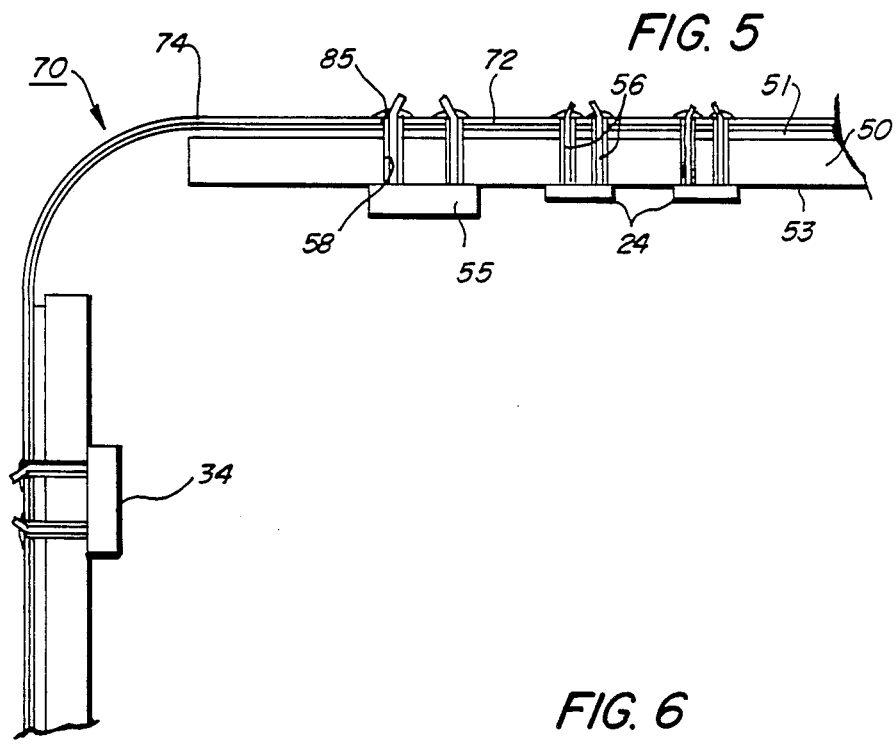
FIG. 5 is an enlarged cross-sectional view of an alternate embodiment depicting another method of attaching the flexible circuits to the printed wiring boards.

In the embodiment shown in FIG. 5 where like numerals refer to like parts, individual circuit components such as LEDs 24, photosensors 34, microprocessor(s), transistors such as transistor 55, and other discrete separably attachable circuit components may be used to secure the flexible printed wiring circuit 70, either alone or in combination with adhesive 76, to substrate 50. For this purpose, both substrate 50 and substrate 72 of flexible printed wiring circuit 70 are provided with aligned holes or apertures 58, 85 respectively either before or after assembly at desired points in the printed circuit where the circuit component is to be mounted. The configuration and dimension of the apertures correspond to the configuration and dimension of the prongs 56 of the circuit component.

During fabrication, the flexible circuit 70 is positioned on the surface 51 of the board substrate 50. Where preformed, the apertures 85 in substrate 72 are aligned with the apertures 58 in the board substrate 50. The circuit component such as transistor 55 is then mounted on the opposite side 53 of substrate 50 by inserting the prongs 56 through the aligned apertures 58, 85 in substrates 50, 72 respectively. The ends of prongs 56 are bent or clenched inwardly to mechanically lock the circuit component such as transistor 55 in position. The prongs 56 are then electrically connected to the conductive runs 74 of the flexible printed wiring circuit by soldering thereby locking the flexible circuit and the circuit component with the printed wiring board therebetween.

Figure 6:
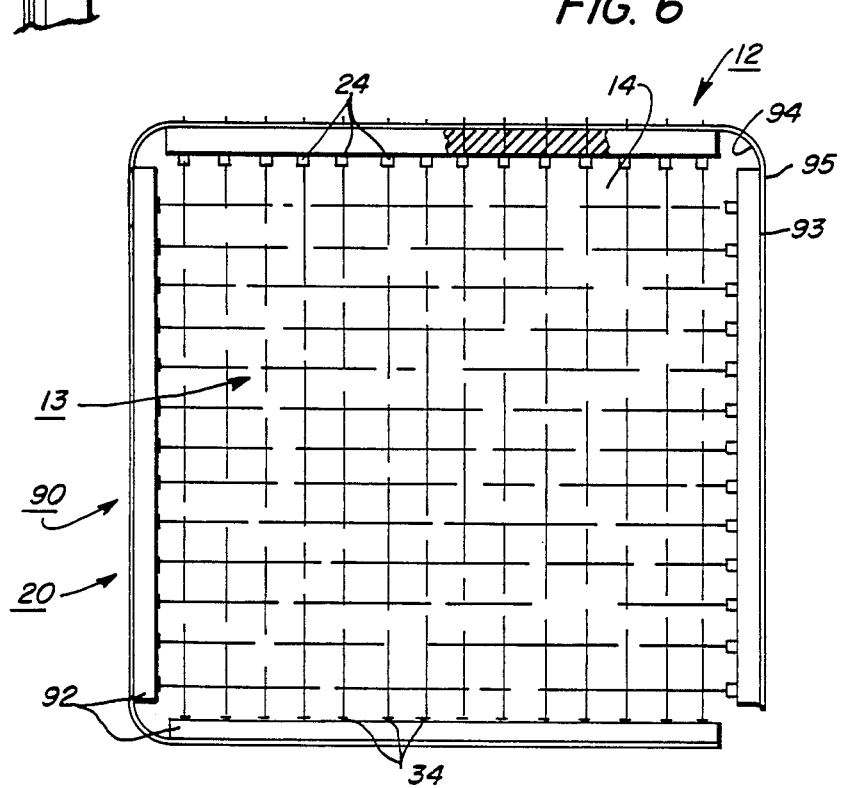
FIG. 6 is a front plane view of a third embodiment in which the pwb's are replaced by a continuous flexible circuit with rigid sheet-like supports for each of the sides of the frame.

In the embodiment shown in FIG. 6 where like numbers refer to like parts, a one piece flexible circuit 90 provides the printed circuit in place of the printed wiring boards. In this embodiment, a generally rectangular relatively rigid sheet-like board 92 similar to substrate 50 is provided for each of the top, bottom, and side edges of CRT 12, boards 92 serving both as a base or support for the flexible circuit 90 and as a support for the various circuit components such as LEDs 24, photosensors 34, transistors such as transistor 55, etc. Flexible circuit 90 has an axial length sufficient to span substantially the entire perimeter of screen 14 of CRT 12.

In assembly, flexible circuit 90 is mounted on boards 92 in proper spaced orientation with the inside surface 94 of the flexible circuit substrate 95 against the outside surface 93 of the boards 92. Circuit 90 is fastened to the boards 92 by adhesive. Apertures in both flexible circuit 90 and boards 92 at the desired positions in the printed circuit permit the various circuit components such as LEDs 24, photosensors 34, etc. to be fitted in place and electrically attached by soldering. The assembly is then formed by bending of the printed wiring circuit 90 at the unsupported areas between adjoining boards into the rectangular frame 20. The finished frame may then be positioned over the screen 14 of CRT 12 and retained in place by the exterior cover 15.

Mechanical attachment of some or all of the individual circuit components such as transistor 55 may be effected through clenching of the component prongs as described heretofore. Further, the use of adhesive may be dispensed with where a sufficient stable attachment is effected through clenching and soldering of the individual circuit components to circuit 90.

While the invention has been described with reference to the structure disclosed, it is not confined to the details set forth, but is intended to cover such modifications or changes as may come within the scope of the following claims.

I claim:

1. For a touch input apparatus of the type having a generally rectangular border each side of which includes a printed wiring board with the wiring boards forming two adjoining sides of said border having a plurality of discrete light sources arranged in at least one longitudinally extending row and the remaining wiring boards forming the opposite two sides of said border each having a photosensor for each of said light sources, the improvement comprising:

means for physically attaching the ends of each pair of said wiring boards to one another so that said wiring boards are at substantially 90° with respect to one another to form said border with said light sources in operative relation with said photosensors, said attaching means comprising a flexible wiring circuit bent through a substantially 90° arc and attached to each of said wiring board pairs to mechanically secure said wiring board pairs together;

said flexible wiring circuit being electrically coupled to said wiring board pairs to form, in cooperating with said wiring boards, circuits for enabling operation of said touch input apparatus.

2. The apparatus according to claim 1 in which each of said wiring boards include a generally rectangular substantially flat substrate of relatively rigid material and plural discrete circuit subcomponents, said individual wiring circuits being disposed on one side of said substrate with said circuit sub-components mounted on the opposite side of said substrate, a portion of each of said circuit sub-components extending through said substrate and being electrically connected to said wiring circuit in predetermined electrical relationship, said connections between said circuit sub-components and said wiring circuit serving to attach said flexible circuits to said boards to form said border.

3. For a touch input apparatus of the type having a generally rectangular border in which two adjoining sides of said border each include an array of light sources arranged in at least one longitudinally extending row while the remaining two sides of said border each include an array of photosensors, there being one photosensor for each of said light sources, the improvement comprising:

a sheet-like board providing a rigid support for each side of said border;

a flexible circuit comprising a one piece circuit having a length sufficient on wrapping of said flexible circuit around the outside of said boards to provide said rectangular border; and means for securing said boards to said flexible circuit to provide said border.

4. The apparatus according to claim 3 including:
plural discrete circuit components,
said circuit components being mounted on the inside of said boards, a portion of each of said circuit components extending through said boards and being electrically connected to said flexible circuit in predetermined electrical relationship thereto, said connections between said circuit components and said flexible circuit serving to attach said flexible circuit and said boards together to form said border.

5. In a touch input system including a CRT with viewing screen on which control selections are displayed, the combination of:

(a) plural printed circuit boards adapted for assembly corner to corner to form a generally rectangular border around the periphery of said screen, said circuit boards along two adjoining sides of said border having a plurality of discrete radiation emitters with the circuit boards on the sides of said border opposite thereto having a plurality of discrete radiation detectors, said radiation detectors and said radiation emitters cooperating to provide a plurality of X, Y radiation lines forming a grid pattern across the face of said screen; and (b) a flexible circuit electrically interconnecting the corners of each of said circuit boards together to complete the electrical circuit for operating said touch input assembly, said flexible circuits being physically secured to the circuit boards associated therewith whereby to retain said boards in permanent fixed relation with one another.

* * * * *